(12) United States Patent
Tanaka et al.

(10) Patent No.: US 6,635,998 B2
(45) Date of Patent: Oct. 21, 2003

(54) ION BEAM PROCESSING APPARATUS AND METHOD OF OPERATING ION SOURCE THEREFOR

(75) Inventors: Shigeru Tanaka, Hitachiota (JP); Isao Hashimoto, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/261,781

(22) Filed: Oct. 2, 2002

(65) Prior Publication Data

US 2003/0030009 A1 Feb. 13, 2003

Related U.S. Application Data

(63) Continuation of application No. 09/458,512, filed on Dec. 13, 1999, now Pat. No. 6,515,426.

(30) Foreign Application Priority Data

Dec. 15, 1998 (JP) ............................................. 10-356606

(51) Int. Cl.[7] .............................................. H01J 27/02
(52) U.S. Cl. ............................ 315/111.81; 315/111.61; 250/423 R; 250/492.3; 313/359.1; 313/362.1; 313/363.1
(58) Field of Search ....................... 315/111.81, 111.61; 250/423 R, 492.3; 313/359.1, 362.1, 363.1

(56) References Cited

U.S. PATENT DOCUMENTS

| | | | |
|---|---|---|---|
| 4,714,834 A | 12/1987 | Shubaly | 250/427 |
| 4,870,284 A | 9/1989 | Hashimoto et al. | 250/423 R |
| 4,873,445 A * | 10/1989 | Le Jeune | 250/423 R |
| 4,916,311 A | 4/1990 | Fuzishita et al. | 250/251 |
| 6,515,426 B1 * | 2/2003 | Tanaka et al. | 315/111.81 |

FOREIGN PATENT DOCUMENTS

| | | |
|---|---|---|
| EP | 0 101 867 | 3/1984 |
| EP | 0 525 927 | 2/1993 |
| GB | 1063199 | 10/1965 |
| GB | 2 295 485 | 5/1996 |
| GB | 2 307 095 | 5/1997 |
| JP | 02-056833 | 2/1990 |

* cited by examiner

Primary Examiner—Nikita Wells
(74) Attorney, Agent, or Firm—Mattingly, Stanger & Malur, P.C.

(57) ABSTRACT

An ion beam processing apparatus and a method of operating an ion source therefore are provided for reducing the frequency of breakdown due to particles, and for increasing an apparatus available time by operating the apparatus in a stable state for a long time and minimizing maintenance operations such as cleaning for the apparatus, and so on. A plasma generating gas is introduced into a vacuum chamber formed of a processing chamber and an ion source mounted thereto to produce a plasma from the gas, and an electric field is applied within the vacuum chamber to extract ions within the plasma as an ion beam. The ion source comprises an arc power supply, an acceleration power supply for applying an acceleration electrode with a positive potential to extract an ion beam, and a deceleration power supply for applying a deceleration electrode with a negative potential to prevent ions from flowing into the ion source. When the ion source is operated, the acceleration electrode is first applied with the positive potential, and then the deceleration electrode is applied with the negative potential.

1 Claim, 3 Drawing Sheets

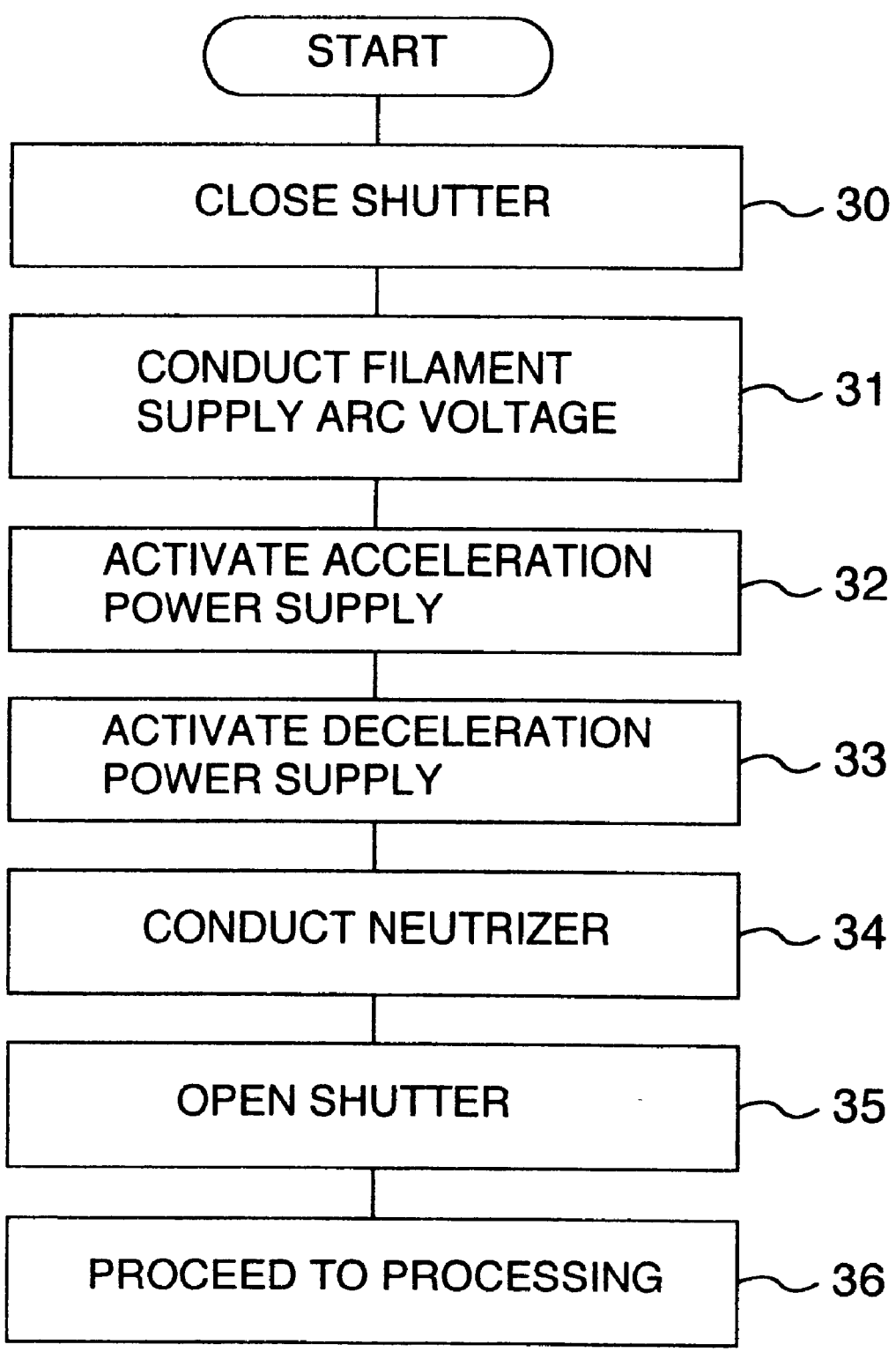

ION BEAM PROCESSING APPARATUS AND METHOD OF OPERATING ION SOURCE THEREFOR

This is a continuation application of U.S. Ser. No. 09/458,512, filed Dec. 13, 1999, now U.S. Pat. No. 6,515, 426 now allowed.

BACKGROUND OF THE INVENTION

The present invention relates generally to an ion beam processing apparatus and a method of operating an ion source therefore, and more particularly to a method of operating an ion source to extract, as an ion beam, ions within a plasma generated in the ion source for use in an ion beam processing apparatus for performing ion beam milling, ion beam sputtering and so on, and a method of operating an ion beam processing apparatus which uses the ion source.

The ion beam processing apparatus employs positive ions which, when irradiated to collide with a workpiece, cause accumulation of a positive charge on the surface of the workpiece, so that the ion beam processing apparatus cannot continuously collide a sufficient ion beam against a processed site on the workpiece. For this reason, a neutralizer has been conventionally provided for irradiating the surface of a workpiece with electrons to maintain the surface of the workpiece in an electrically neutral state.

The neutralizer is operated to fill a processing chamber which contains a workpiece with electrons prior to the processing on the workpiece such that the neutralization on the surface of the workpiece can be started simultaneously with the irradiation of an ion beam to the workpiece.

Conventionally, an ion generator typically produces a plasma to generate ions when the ion source is started, while the neutralizer produces electrons within the processing chamber. It is therefore required to provide a shielding feature for preventing the electrons from flowing into the ion generator from the processing chamber. Such a shielding feature is implemented by initially activating a deceleration power supply in an ion source to apply a deceleration electrode with a negative voltage, and subsequently activating an acceleration power supply to apply an acceleration electrode with a positive voltage.

However, when an ion source operating method as mentioned above is applied to the ion beam processing apparatus, particles possibly attached on the electrodes of the ion source to form short-circuiting between the acceleration electrode and the deceleration electrode would cause repeated breakdowns of the deceleration power supply which has been first activated.

The breakdown of the ion source power supply mainly results from the short-circuiting between the electrodes of the ion source due to particles attached thereon. Such particles are in most cases electrically conductive materials which are sputter deposits once attached on and coming off of a wall surface within the processing chamber. When the acceleration electrode and the deceleration electrode of the ion source are applied with respective voltages with such particles attached on portions of these electrodes, the two electrodes are short-circuited to cause a sequence of repeated operations involving a short-circuit current flowing into the ion source power supply, the ion source power supply being shut down in response to a detected excessive current, and the voltage applied again after a predetermined time period. This sequence of operations will be repeated until the particles causing the short-circuiting are burnt away or removed from the electrodes by the short-circuiting current.

Typically, in the ion source power supplies, the acceleration power supply is designed to have a larger current capacity than the deceleration power supply. For example, an ion source power supplies may be a combination of an acceleration power supply having a maximum output of 1.3 kv, 3 A and a deceleration power supply having a maximum output of 500 v, 0.2 A. This is because the acceleration and deceleration power supplies need not have the same capacity in view of the optimization for the configuration of the entire ion source power supplies. More specifically, the acceleration power supply is required to supply an ion beam current when an ion beam is extracted, whereas the deceleration power supply hardly has to supply a current for the ion beam.

In addition, values for detecting excessive currents of the respective power supplies are typically set in proportion to the rated maximum current values of the respective power supplies, so that the excessive current detection functions at a lower excessive current for a power supply having a smaller current capacity. Thus, if particles are attached on portions of the electrodes of the ion source, a short-circuiting current flows through particles when a deceleration voltage is applied, and activates the excessive current detection in the deceleration power supply to once shut down the deceleration power supply. Then, in a predetermined time period, the deceleration voltage is again applied. This sequence of operations is repeated to keep the acceleration power supply from activating indefinitely.

Further, with particles of small size, a short-circuiting current flowing through such particles results in burning off and consequently removing the particles from the electrodes. However, if particles have a certain large size, a short-circuiting current flowing in the deceleration power supply having a small capacity is not enough to burn off the particles which are therefore left on the electrodes, thus forcing the ion source to repeat a sequence of operations involving excessive current detection, trip (breakdown) and re-activation.

For the user of these apparatus, it is important to operate the apparatus in a stable state for a long period, minimize maintenance operations such as cleaning for the apparatus, and increase an apparatus available time resulting from the minimized maintenance operations. For achieving these objects, it is critical to minimize the frequency of the occurrence of breakdown, activate the apparatus in a stable state as early as possible, and maintain the stable operating state.

Generally, the breakdown frequently occurs in the ion source due to particles attached on the electrodes of the ion source upon powering on the apparatus after cleaning the inside of the apparatus or after cleaning the electrodes of the ion source. A conventional method of operating the ion source, however, suffers from difficulties in removing particles, contributing to the breakdown, from the electrodes of the ion source, and consequent occurrence of repeated breakdowns. To reach a stable operating state substantially free from the breakdown, a long time is required. In some cases, the electrodes of the ion source must be frequently cleaned in order to improve such situations, thus experiencing difficulties in improving the apparatus available time.

SUMMARY OF THE INVENTION

In view of the problems inherent to the prior art as mentioned above, it is an object of the present invention to provide an ion beam processing apparatus and a method of operating an ion source therefor which are capable of reducing the frequency of the occurrence of breakdown to smoothly activate the ion source, as well as accomplishing reduced requirements for maintenance such as cleaning the electrodes of the ion source and so on, a higher reliability and an improved operating efficiency of the apparatus.

According to the present invention, an ion source is mounted to a processing chamber to form a vacuum chamber into which a gas is introduced to produce a plasma, and an electric field is applied within the vacuum chamber to extract ions within the plasma as an ion beam. The ion source comprises an arc power supply, an acceleration power supply for applying an acceleration electrode with a positive potential to extract an ion beam, and a deceleration power supply for applying a deceleration electrode with a negative potential to prevent ions from flowing into the ion source. When the ion source is operated, the acceleration electrode is first applied with a positive potential, and the deceleration electrode is applied with a negative potential after or simultaneously with the application of the acceleration electrode with the positive potential.

BRIEF DESCRIPTION OF THE DRAWINGS

FIG. 3 is a flow diagram illustrating various steps involved in the operational procedure according to the present invention.

DETAILED DESCRIPTION OF THE INVENTION

Figure 1:
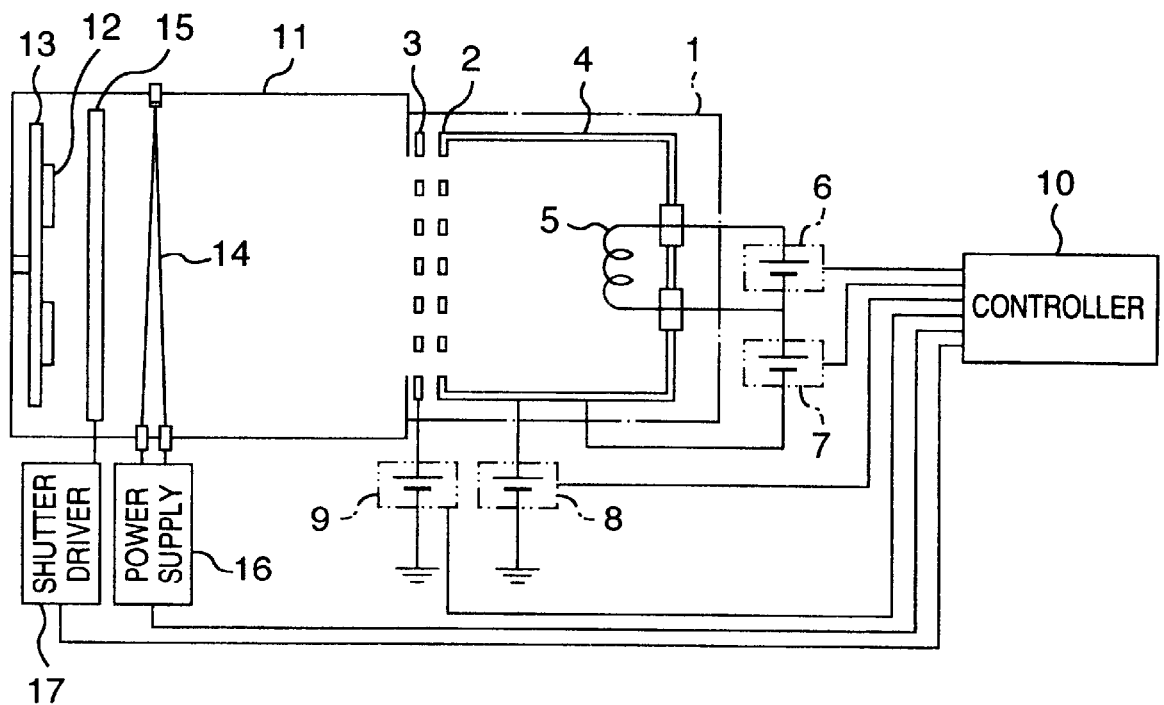
FIG. 1 is a schematic diagram illustrating the configuration of an ion beam processing apparatus according to the present invention.

FIG. 1 is a schematic diagram illustrating the configuration of an ion beam processing apparatus according to an embodiment of the present invention.

Referring specifically to FIG. 1, an ion source, generally designated by reference numeral 1, comprises an acceleration electrode 2 which is applied with a positive potential; a deceleration electrode 3 which is applied with a negative potential; an ion source chamber 4; and a filament 5 for emitting thermoelectrons. The illustrated ion beam processing apparatus further comprises a filament power supply 6 for heating the filament 5; an arc power supply 7 for producing a plasma within the ion source chamber 4; an acceleration power supply 8 for applying the acceleration electrode 2 with an acceleration voltage for extracting an ion beam; a deceleration power supply 9 for applying the deceleration electrode 3 with a deceleration voltage for preventing electrons flowing into the ion source chamber 4 from a processing chamber 11; a controller 10 for operating the respective power supplies 6, 7, 8, 9; and the processing chamber 11.

The processing chamber 11 contains a holder 13 for carrying workpieces 12; a neutralizer 14 for generating electrons; and a shutter 15 for preventing an ion beam from being irradiating to the workpieces 12. The processing chamber 11 is externally provided with a power supply 16 for the neutralizer 14 and a shutter driver 17. The power supply 16 and the shutter driver 17 are controlled by the controller 10.

The ion source 1 is mounted to the processing chamber 11 and used in the form of a vacuum chamber. The controller 10 controls voltages applied to, currents generated in, and operating timings for the filament power supply 6, the arc power supply 7, the acceleration power supply 8, the deceleration power supply 9, the neutralizer power supply 16, and the shutter driver 17.

A conventional operational procedure involves introducing a plasma generating gas into the ion source 1; conducting the filament 5 after a predetermined pressure is reached within the ion source 1, and activating the deceleration power supply 9 to apply the deceleration electrode 3 with a deceleration voltage. Subsequently, the operational procedure proceeds to the activation of the acceleration power supply 8 to apply the acceleration electrode 2 with an acceleration voltage, and final application of an arc voltage from the arc power supply 7 to produce a plasma from which an ion beam is extracted. As previously described, with this operational procedure or method, when the deceleration electrode 3 is applied with the deceleration voltage with particles attached on portions of the acceleration electrode 2 and the deceleration electrode 3 of the ion source, a short-circuiting state is formed between the acceleration electrode 2 and the deceleration electrode 3 to cause a short-circuiting current to flow into the deceleration power supply 9, which is detected as an excessive current to shut down the deceleration power supply 9. Then, after the lapse of a predetermined time, the deceleration power supply 9 is again powered up to apply the deceleration electrode 3 with the deceleration voltage. This sequence of operations is repeated.

Figure 2:
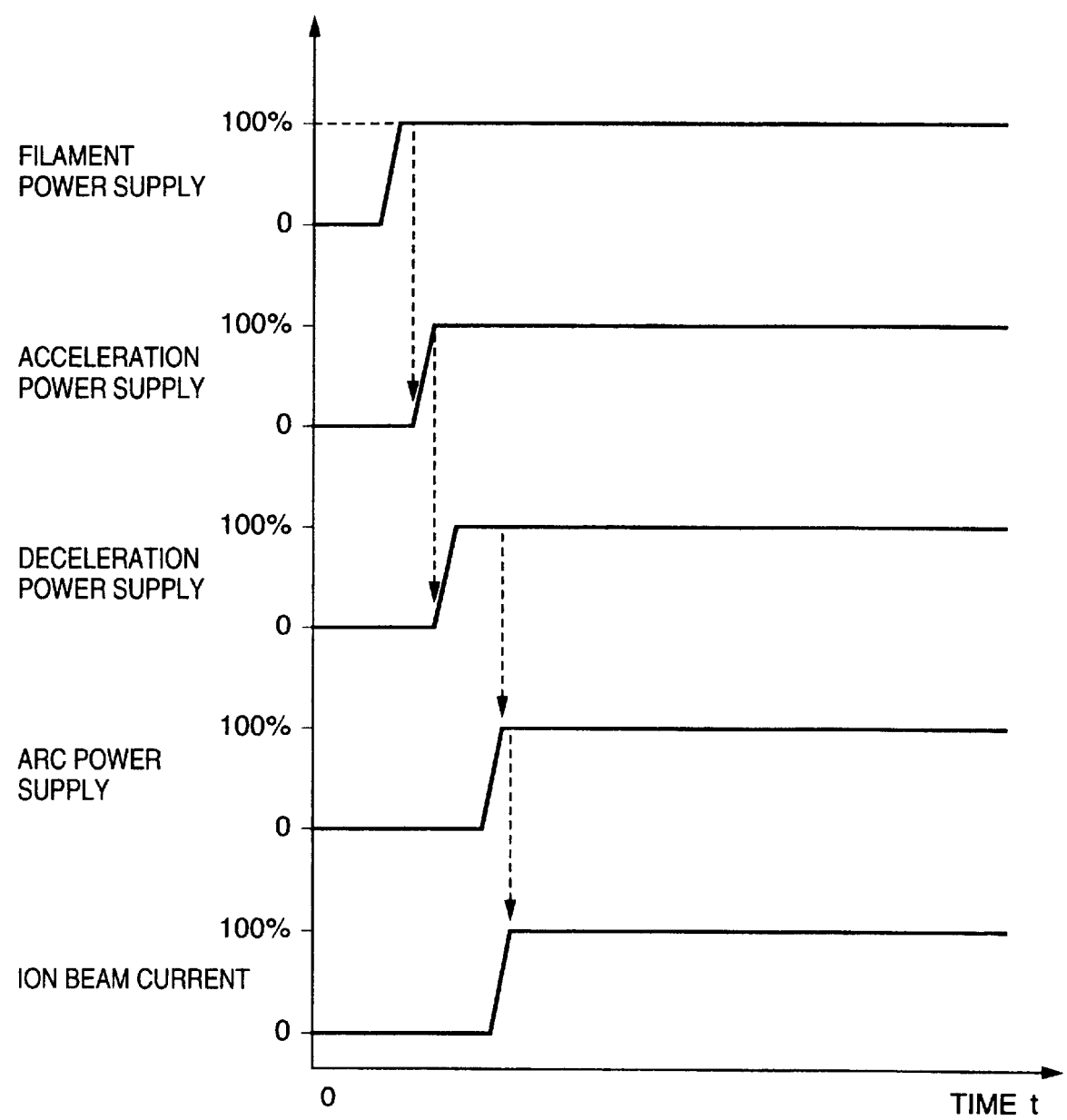
FIG. 2 is a time chart illustrating an operational procedure according to the present invention.

FIG. 2 is a diagram for explaining an operational procedure for an ion source according to the present invention.

As indicated by arrows, this operational procedure involves introducing a plasma generating gas into the ion source 1; conducting the filament 5 after a predetermined pressure is reached in the ion source 1; next activating the acceleration power supply 8 to apply the acceleration electrode 2 with an acceleration voltage; subsequently activating the deceleration power supply 9 to apply the deceleration electrode 3 with a deceleration voltage; and finally applying an arc voltage from the arc power supply 7 to extract an ion beam.

The foregoing is basic principles and operations of the present invention described with reference to the time chart illustrated in FIG. 2. In the following, a preferred operational procedure of the present invention will generally be described with reference to a flow chart illustrated in FIG. 3.

FIG. 3 is a flow chart illustrating the operation of the controller 10 according to the present invention. Referring specifically to FIG. 3, as the controller 10 starts operating, first at step 30, the shutter driver 17 is operated to close the shutter 15 to protect the workpieces 12 from being irradiated with ions or electrons from the ion source. Next, at step 31, a plasma generating gas is introduced into an ion source 4, and then, the filament power supply 6 is operated to conduct the filament 5, and the arc power supply 7 is forced to supply an arc voltage. Then, at step 32, the acceleration power supply 8 is operated to supply the acceleration electrode 2 with an acceleration voltage. Next, at step 33, the deceleration power supply 9 is operated to supply the deceleration electrode 3 with a deceleration voltage. Further, at step 34, the neutralizer power supply 16 is operated to conduct the neutralizer 14 to produce electrons for neutralizing the surface of the workpiece 12.

With a sequence of the foregoing operations, the ion source is now ready for activation. Subsequently, at step 35, the shutter driver 17 is operated to open the shutter 15, followed by proceeding to step 36, where the workpieces 12 are processed.

According to the foregoing operational procedure, with particles attached on portions of the acceleration electrode 2 and the deceleration electrode 3, the acceleration power supply 8 having a larger power supply capacity first applies an acceleration voltage to form a short-circuiting state between the acceleration electrode 2 and the deceleration electrode 3 through the particles to cause a short-circuiting current to flow from the acceleration power supply 8. The short-circuiting current continues to flow through the particles on the electrodes 2, 3 until the acceleration power supply 8 stops outputting the acceleration voltage in response to the detection of an excessive current. Since the acceleration power supply 8 has a rated maximum current value as high as several amperes, the acceleration power supply 8 will not trip until the short-circuiting current reaches an excessive current set value slightly higher than the rated maximum current value, for example, 120% of the rated maximum current value.

In this way, according to the method of operating the ion source of this embodiment, since the acceleration power supply 8 has a larger power supply capacity, a larger short-circuiting current can be generated, and accordingly a time period until an excessive current is detected can be made longer than the conventional method of operating an ion source. Thus, the particles, causing the short-circuiting between the electrodes 2, 3, can be applied with a larger short-circuiting current for a longer time than the conventional operating method. Heat generated by the conducted short-circuiting current causes the particles to heat and burn away, or the particles are removed from the electrodes by electric shock such as discharge or evaporated due to the vacuum environment, thus efficiently eliminating the short-circuiting state between the electrodes 2, 3.

Further, according to this embodiment, since a larger short-circuiting current can be applied for a longer time by the acceleration power supply 8 having a large power supply capacity, it is possible to remove particles in a shorter time if the particles have the same size as well as to remove particles having a large size which cannot be removed in the prior art due to an insufficient current. As a result, even if the breakdown occurred, it could be solved in a shorter time. It is also possible to reduce the frequency of maintenance operations such as cleaning for the electrodes of the ion source in order to fix the breakdown.

In the foregoing embodiment, after the acceleration power supply 8 is activated to apply the acceleration electrode 2 with an acceleration voltage, the deceleration power supply 9 is activated to apply the deceleration electrode 3 with a deceleration voltage. Alternatively, the acceleration power supply 8 and the deceleration power supply 9 may be simultaneously activated to apply the acceleration electrode 2 and the deceleration electrode 3 with an acceleration voltage and a deceleration voltage, respectively. In this case, since the sum of the voltages generated by the acceleration power supply 8 and the deceleration power supply 9 is applied across the acceleration electrode 2 and the deceleration electrode 3, a larger short-circuiting current can be generated, thereby making it possible to remove particles in a shorter time.

According to the present invention, since the voltages of the ion source power supplies are applied in such an order that the deceleration voltage is applied after or simultaneously with the application of the acceleration voltage, it is possible to reduce the frequency of the occurrence of breakdown in the ion source, which is problematic in an ion beam processing apparatus or the like, particularly, the breakdown that occurs due to particles attached on the electrodes inherent in the ion source, to smoothly activate the ion source, and to realize a stable operation of the apparatus such as reduced requirements for maintenance operations such as cleaning for the electrodes of the ion source or the like, a higher reliability of the apparatus, an improved operating efficiency of the apparatus, and so on.

What is claimed is:

1. A method of operating an ion source for an ion beam processing apparatus, said ion source including an arc power supply, for applying a positive voltage to an acceleration electrode to extract an ion beam, and a deceleration power supply for applying a negative voltage to a deceleration electrode for preventing electrons from flowing into said ion source, wherein a gas is introduced into said ion source to produce a plasma from gas, and an electric field is formed to extract ions within said plasma as an ion beam, said method comprising the steps of:

simultaneously applying the positive voltage and a negative voltage to said acceleration electrode and said deceleration electrode, respectively, to cause a short-circuiting current to flow between said acceleration electrode and said deceleration electrode; and thereafter, applying predetermined voltages to said acceleration electrode and said deceleration electrode, respectively, to extract the ion beam from said ion source.

* * * * *